United States Patent
Tsai et al.

(10) Patent No.: US 9,823,528 B2
(45) Date of Patent: Nov. 21, 2017

(54) ARRAY SUBSTRATE AND LIQUID CRYSTAL DISPLAY DEVICE USING SAME

(71) Applicant: Ye Xin Technology Consulting Co., Ltd., Hsinchu (TW)

(72) Inventors: Wu-Liu Tsai, Hsinchu (TW); Yi-Chun Kao, Hsinchu (TW); Hsin-Hua Lin, Hsinchu (TW); Po-Li Shih, Hsinchu (TW); Chih-Lung Lee, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 224 days.

(21) Appl. No.: 14/474,553

(22) Filed: Sep. 2, 2014

(65) Prior Publication Data
US 2015/0060973 A1 Mar. 5, 2015

(30) Foreign Application Priority Data
Aug. 30, 2013 (TW) .............. 102131190 A (51) Int. Cl.
| | | |
|---|---|---|
| *G02F 1/1335* | (2006.01) | |
| *G02F 1/1362* | (2006.01) | |
| *H01L 27/12* | (2006.01) | |
| *G02F 1/1343* | (2006.01) | |
| *G02F 1/1333* | (2006.01) | |

(52) U.S. Cl.
CPC .. *G02F 1/136213* (2013.01); *G02F 1/133555* (2013.01); *G02F 1/134309* (2013.01); *G02F 1/134363* (2013.01); *H01L 27/1244* (2013.01); *H01L 27/1255* (2013.01); *G02F 1/136227* (2013.01); *G02F 2001/133397* (2013.01); *G02F 2001/134372* (2013.01)

(58) Field of Classification Search
CPC ............ G02F 1/1368; G02F 1/136286; G02F 1/133345; G02F 1/134309; G02F 1/136227; G02F 1/133707; G02F 1/134336; G02F 1/13439; G02F 1/1337; G02F 1/134363; G02F 2001/134372; G02F 1/136213; G02F 1/13394; G02F 1/133788; G02F 2001/133397; G02F 1/133555; H01L 27/3248; H01L 27/124; H01L 27/14603–27/14616; H01L 27/1463; H01L 27/3211–27/3218
USPC ................................................ 349/113, 114
See application file for complete search history.

(56) References Cited

U.S. PATENT DOCUMENTS

| | | | |
|---|---|---|---|
| 7,274,044 B2 * | 9/2007 | Kawakami | H01L 51/5262 257/79 |
| 9,076,746 B2 * | 7/2015 | Chung | H01L 27/3276 |
| 2005/0001807 A1 * | 1/2005 | Lee | G02F 1/134363 345/92 |

(Continued)

FOREIGN PATENT DOCUMENTS

| | | |
|---|---|---|
| CN | 1971388 | 5/2007 |
| CN | 102033365 | 4/2011 |

*Primary Examiner* — Mary Wilczewski
*Assistant Examiner* — Tsz Chiu
(74) *Attorney, Agent, or Firm* — ScienBiziP, P.C.

(57) ABSTRACT

An array substrate for a liquid crystal display device includes a first storage capacitor and a second storage capacitor for increased capacitance. The first storage capacitor is formed by a first common electrode and a pixel electrode. The second storage capacitor is formed by a second common electrode and the pixel electrode.

18 Claims, 9 Drawing Sheets

(56) References Cited

U.S. PATENT DOCUMENTS

| | | | |
|---|---|---|---|
| 2006/0164565 A1* | 7/2006 | Lee | G02F 1/133707 349/43 |
| 2006/0192906 A1* | 8/2006 | Ryu | G02F 1/133345 349/43 |
| 2006/0250537 A1* | 11/2006 | Lee | G02F 1/13624 349/43 |
| 2006/0261335 A1* | 11/2006 | Nakahori | G02F 1/133555 257/59 |
| 2007/0019126 A1* | 1/2007 | Rhee | G02F 1/1362 349/56 |
| 2007/0097303 A1* | 5/2007 | Sonoda | G02F 1/133345 349/122 |
| 2007/0126968 A1* | 6/2007 | Uochi | G02F 1/134363 349/141 |
| 2007/0171319 A1* | 7/2007 | Fujita | G02F 1/134309 349/43 |
| 2009/0002591 A1* | 1/2009 | Yamazaki | G02F 1/1368 349/43 |
| 2009/0040442 A1* | 2/2009 | Tanno | G02F 1/133555 349/114 |
| 2009/0309101 A1 | 12/2009 | Kim et al. | |
| 2011/0085121 A1 | 4/2011 | Jeon et al. | |
| 2016/0155787 A1* | 6/2016 | Lee | H01L 51/5262 257/72 |

* cited by examiner

FIG. 9 ically, an FFS-LCD has a high aperture ratio and a wide viewing angle. To improve a resolution of the FFS-LCD, a density of the pixel electrodes may be increased while a capacitance of a storage capacitor is decreased.

ARRAY SUBSTRATE AND LIQUID CRYSTAL DISPLAY DEVICE USING SAME

CROSS-REFERENCE TO RELATED APPLICATIONS

This application claims priority to Taiwanese Patent Application No. 102131190 filed on Aug. 30, 2013 in the Taiwan Intellectual Property Office, the contents of which are incorporated by reference herein.

FIELD

The disclosure generally relates to a liquid crystal display device including an array substrate.

BACKGROUND

A fringe field switching liquid crystal display (FFS-LCD) device has one or more common electrodes and a plurality of pixel electrodes formed on an array substrate. The common electrode and the pixel electrodes drive a plurality of liquid crystal molecules by means of a fringe field. Generally, an FFS-LCD has a high aperture ratio and a wide viewing angle. To improve a resolution of the FFS-LCD, a density of the pixel electrodes may be increased while a capacitance of a storage capacitor is decreased.

The storage capacitor is formed by the common electrode and the pixel electrodes, with an insulation layer sandwiched between the common electrode and the pixel electrodes. The capacitance of the storage capacitor is calculated by a formula: $C_{ST}=\in A/d$, wherein $C_{ST}$ denotes the capacitance of the storage capacitor, $\in$ denotes a dielectric constant of the insulation layer, A denotes an active area of the common electrode and the pixel electrode, and d denotes a thickness of the insulation layer. Thus, the capacitance of the storage capacitor is directly proportional to the active area A and is inversely proportional to the thickness d.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Figure 1:
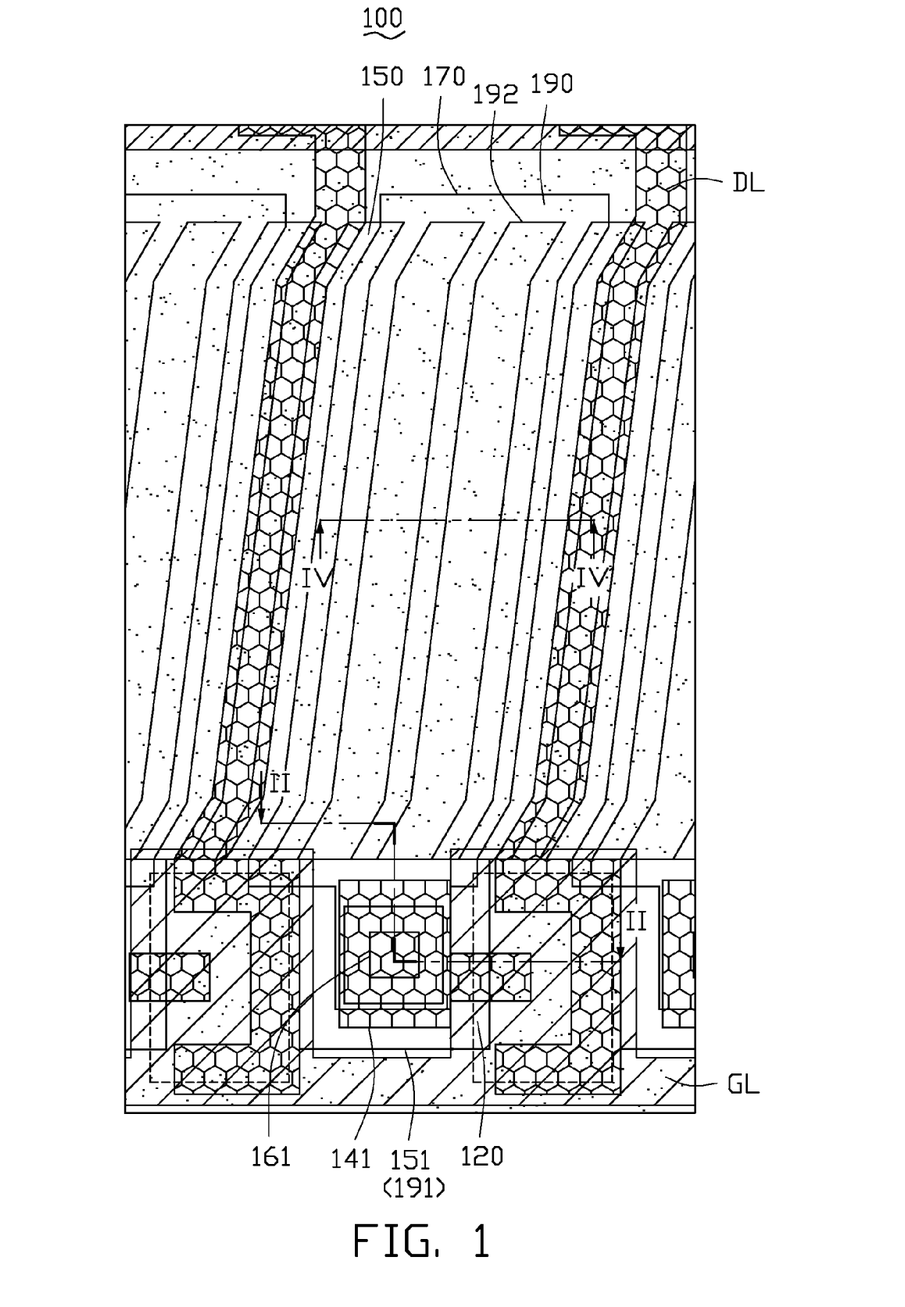
FIG. 1 is a cross-sectional plan view of an array substrate of a liquid crystal display device according to a first embodiment.

FIG. 1 shows a cross-sectional plan view of an array substrate 100 of a liquid crystal display device according to a first embodiment. In the embodiment, the liquid crystal display device can be a fringe field switching liquid crystal display (FFS-LCD) device. The array substrate 100 can include a plurality of scanning lines GL and a plurality of data lines DL. The scanning lines GL are parallel to each other. The data lines DL are parallel to each other, and independently intersect with the scanning lines GL. The scanning lines GL and the data lines DL define multiple sub-pixels where the scanning lines GL cross the data lines DL. Each sub-pixel can include a thin film transistor (TFT) 120 and a pixel electrode 170. In the embodiment, the pixel electrode 170 can be a plate-like structure in the sub-pixel, to couple to the TFT 120.

The array substrate 100 further includes a first common electrode 150 and a second common electrode 190. In the embodiment, the array substrate 100 includes a three-layer electrode structure. The first common electrode 150 overlaps with the second common electrode 190. The first common electrode 150 covers the multiple sub-pixels and the second common electrode 190 covers the first common electrode. In the embodiment, the first common electrode 150 can be a plate-like structure. The second common electrode 190 can include a plurality of parallel slits 192. A fringe field is formed between the second common electrode 190 and the pixel electrode 170 to drive a plurality of liquid crystal molecules (not shown). In FIG. 1, the slits 192 can be strip-shaped. In another embodiment, the slits 192 can be <-shaped or other angled shape.

Figure 2:
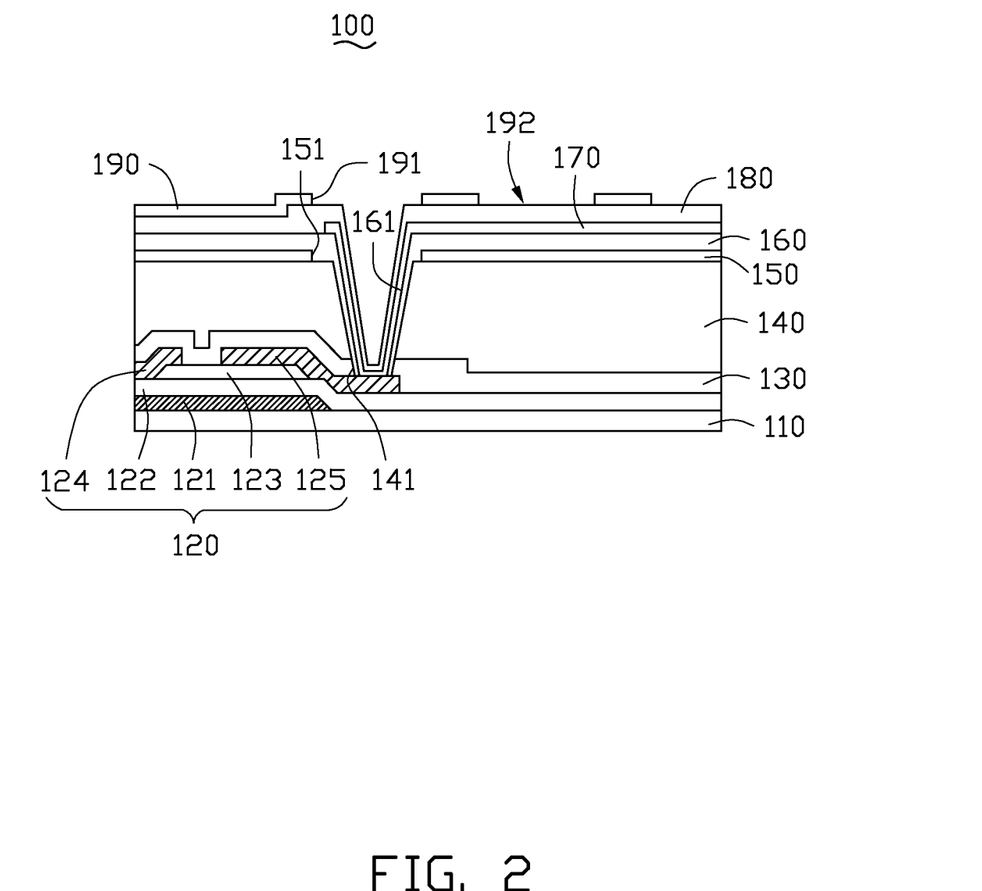
FIG. 2 is a sectional view of the array substrate along line II-II of FIG. 1.

FIG. 2 shows a sectional view of the array substrate 100 along line II-II of FIG. 1. The array substrate 100 further includes a substrate 110, a passivation layer 130, a planar layer 140, and a first protection layer 160. The TFT 120 is arranged on the substrate 110. Each TFT 120 can include a gate 121, a gate insulator 122, a channel layer 123, a source 124, and a drain 125. The gate 121 is located on the substrate 110 and is covered by the gate insulator 122. The channel layer 123 is arranged on the gate insulator 122 to correspond to the gate 121. The source 124 and the drain 125 are located on opposite sides of the channel layer 123.

The passivation layer 130 covers the TFT 120 and the substrate 110, while the passivation layer 130 itself is covered by the planar layer 140. In the embodiment, the planar layer 140 is made of organic materials and a thickness of the planar layer 140 is greater than a thickness of the passivation layer 130. A first opening hole 141 is defined to pass through the passivation layer 130 and the planar layer 140 to expose one part of the drain 125.

A second opening hole 151 is defined in the first common electrode 150 and communicates with the first opening hole 141. A diameter of the second opening hole 151 is greater than a diameter of the first opening hole 141. The first opening hole 141 in cooperation with the second opening hole 151 defines a connecting hole. Internal walls of both the first and second opening holes 141 and 151 are covered by the first protection layer 160. A third opening hole 161 is defined in the first protection layer 160 to expose one part of the drain 125 via the connecting hole defined by the first and second opening holes 141 and 151. The pixel electrode 170 is arranged on the first protection layer 160 to connect to the drain 125 via the third opening hole 161.

The second protection layer 180 is arranged on and covers the pixel electrode 170 of the substrate 110, such that the pixel electrode 170 at the third opening hole 161 is protected by the second protection layer 180. A fourth opening hole 191 is defined in the second common electrode 190 and communicates with the third opening hole 161 which is covered by the second protection layer 180. The second common electrode 190 is arranged on the second protection layer 180. The fourth opening hole 191 and the second opening hole 151 have the same diameter. In the embodiment, the fourth opening hole 191 and the second opening hole 151 are coaxial with the first opening hole 141. The fourth opening hole 191 is defined in the second common electrode 190 to avoid any short circuit between the second common electrode 190 and the pixel electrode 170.

Figure 3:
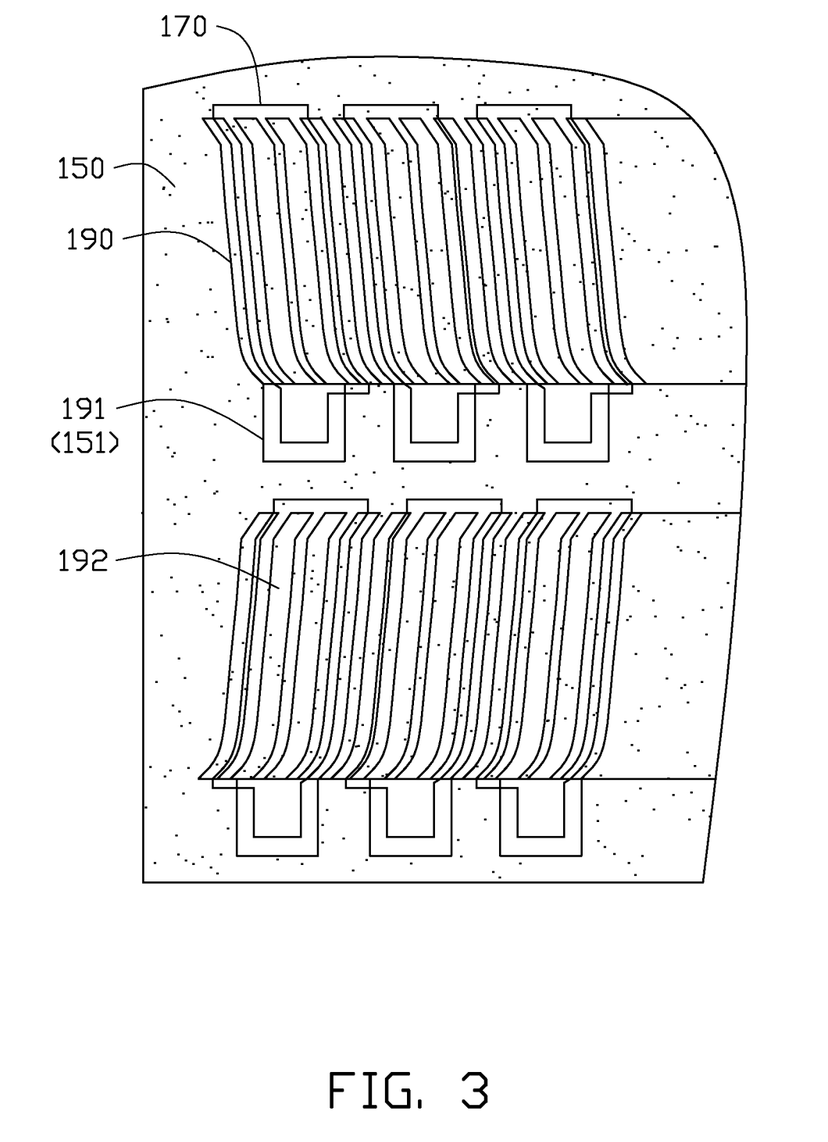
FIG. 3 is a partial sectional view of an electrode structure of the array substrate of FIG. 1.

FIG. 3 shows a partial sectional view of an electrode structure of the array substrate 100. The first common electrode 150 covers the plurality of sub-pixels in an unbroken fashion, and the second opening hole 151 is defined in the first common electrode to correspond to each sub-pixel. The pixel electrodes 170 are plate-shaped structures, and each pixel electrode 170 is arranged in one sub-pixel. The second common electrode 190 unbrokenly covers the first common electrode 150. The fourth opening hole 191 is defined in the second common electrode 190 to correspond to each sub-pixel. A plurality of slits 192 is defined in the second common electrode 190. The slits 192 are symmetrical between two adjacent sub-pixels.

Figure 4:
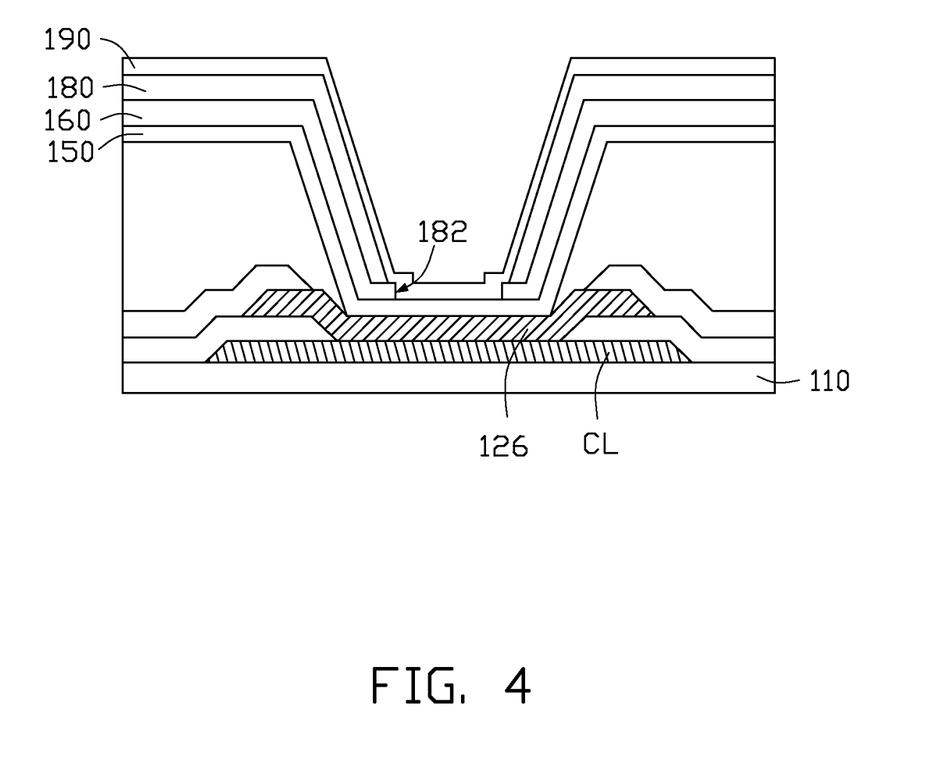
FIG. 4 is a sectional view of a pad of a common electrode of the array substrate of the array substrate of the FIG. 1.

FIG. 4 shows a sectional view of a pad of a common electrode of the array substrate 100. The array substrate 100 can further include a common line CL arranged on the substrate 110. The first protection layer 160 and the second protection layer 180 are sandwiched between the first common electrode 150 and the second common electrode 190. A through hole 182 is defined to pass through the first protection layer 160 and the second protection layer 180. One part of the first common electrode 150 is coupled to the second common electrode 190 via the through hole 182. The first common electrode 150 is electrically coupled to the common line CL to receive a common signal. The first common electrode 150 can be coupled to the common line CL via a metal layer 126 arranged on the common line CL. The metal layer 126 can be made of the same material as that of the data line DL, the source 124, and the drain 125.

Figure 5:
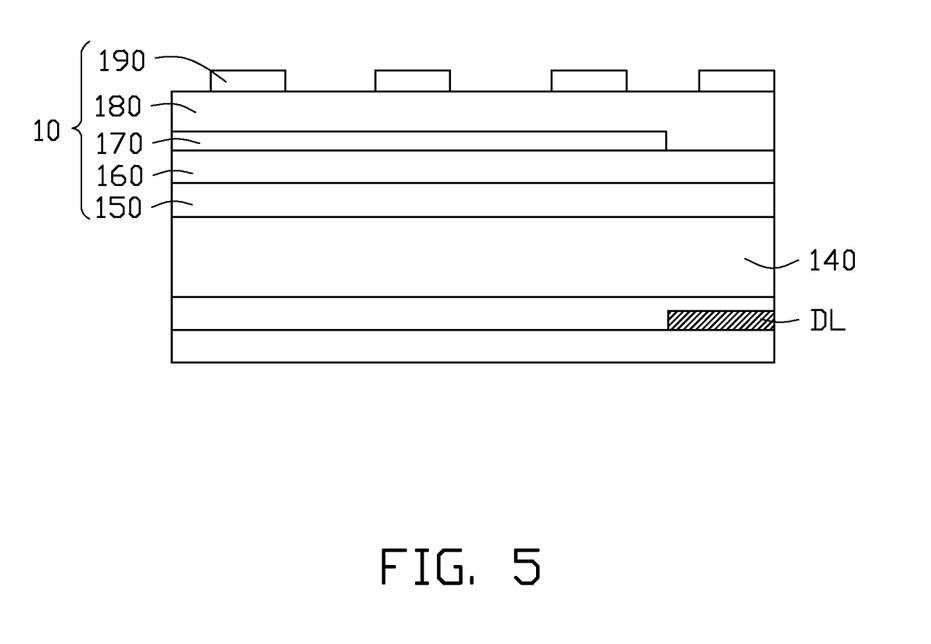
FIG. 5 is a sectional view of the array substrate along line IV-IV of FIG. 1.

FIG. 5 shows a sectional view of the array substrate 100 along line IV-IV of FIG. 1. The storage capacitor 10 is located in the planar layer 140. The storage capacitor 10 is formed by the first common electrode 150, the first protection layer 160, the pixel electrode 170, the second protection layer 180, and the second common electrode 190. The pixel electrode 170, the first common electrode 150, and the second common electrode 190 are made of a transparent conductive material such as indium-tin-oxide (ITO) or indium-zinc-oxide (IZO). The first protection layer 160 and the second protection layer 180 are made of an insulated material such as silicon oxide (SiOx) or silicon nitride (SiNx).

The first common electrode 150 overlaps a portion of the pixel electrode 170 to form a first storage capacitor. The second common electrode 190 overlaps the other portion of the pixel electrode 170 to form a second storage capacitor. The first storage capacitor is coupled with the second storage capacitor in parallel. The array substrate 100 includes the second common electrode 190 to increase a storage capacitance per unit area of the array substrate 100.

Figure 6:
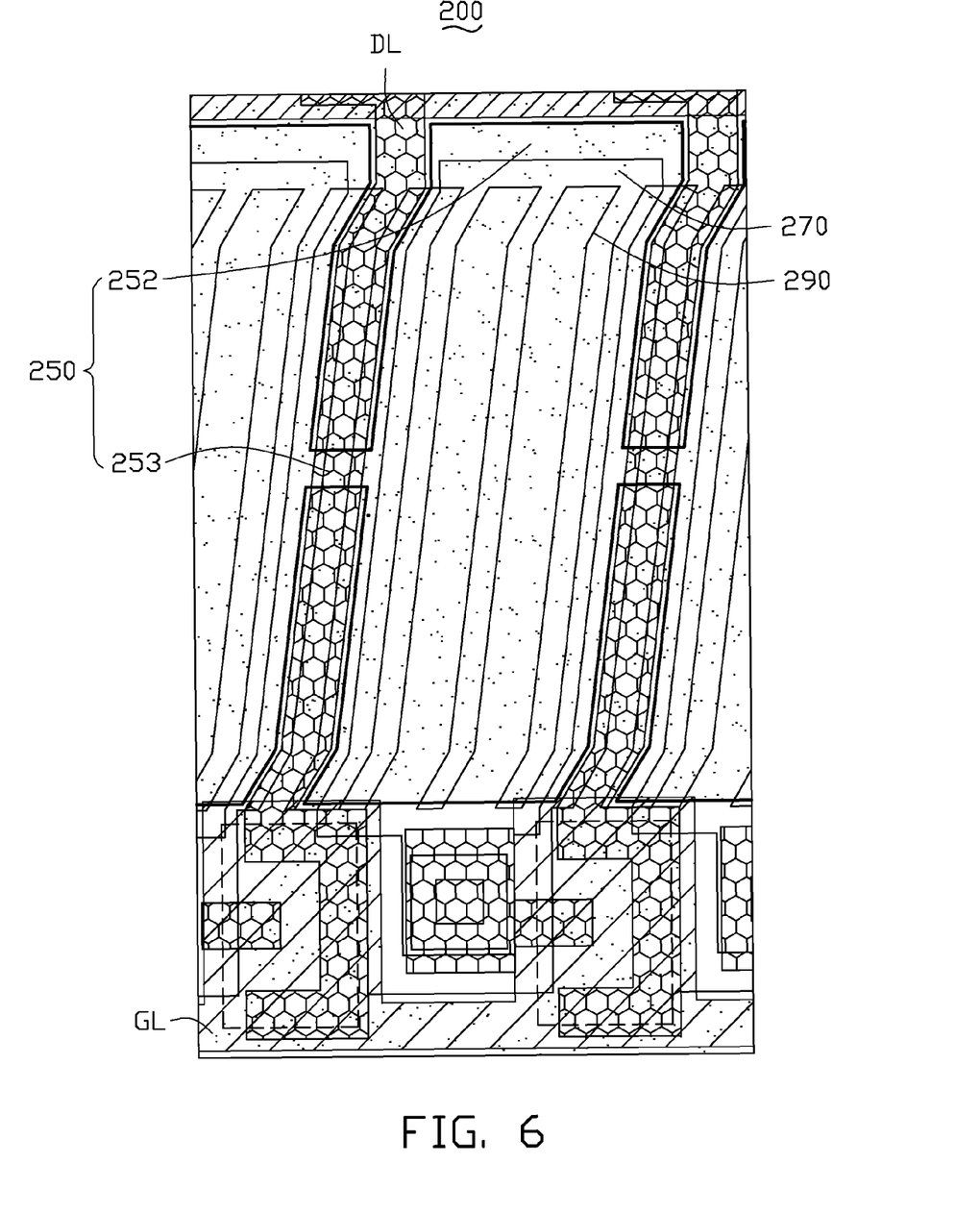
FIG. 6 is a cross-sectional plan view of an array substrate of a liquid crystal display device according to a second embodiment.
Figure 7:
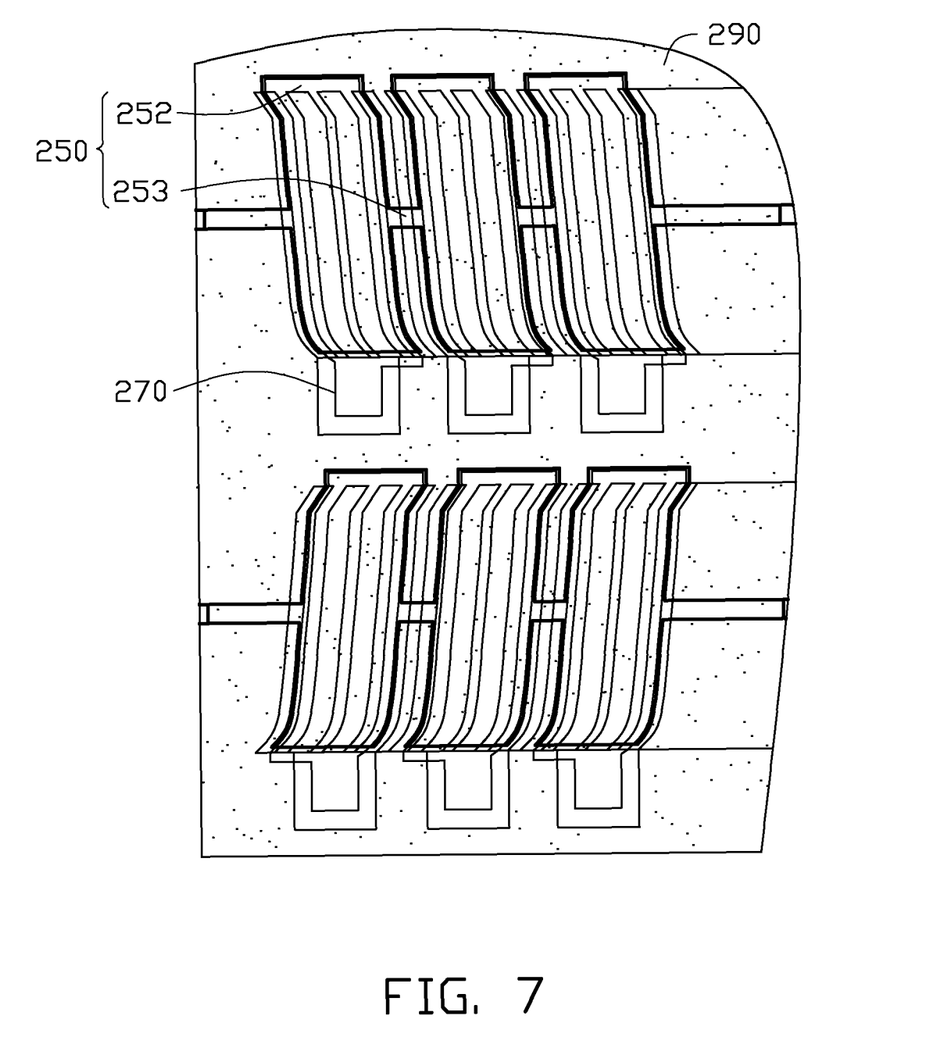
FIG. 7 is a partial sectional view of an electrode structure of the array substrate of FIG. 6.

FIG. 6 shows a cross-sectional plan view of an array substrate 200. FIG. 7 shows a partial sectional view of an electrode structure of the array substrate 200. The array substrate 200 can include a first common electrode 250, a pixel electrode 270, and a second common electrode 290. The array substrate 200 is similar to the array substrate 100 except that the first common electrode 250 covers one part of the data line DL. As an overlapping area between the first common electrode 250 and the data line DL is decreased, a parasitic capacitance between the first common electrode 250 and the data line DL is also decreased. The first common electrode 250 can include a plurality of strip-shaped common electrodes 252 and a plurality of connection portions of the first common electrode 253. Each strip-shaped common electrode 252 is located in one sub-pixel and each connection portion of the first common electrode 253 is located between two adjacent sub-pixels in one row. The plurality of strip-shaped common electrodes 252 extends along the scanning line GL. No strip-shaped common electrode 252 overlaps with the data line DL. The connection portion of the first common electrode 253 does overlap one part of data line DL.

Figure 8:
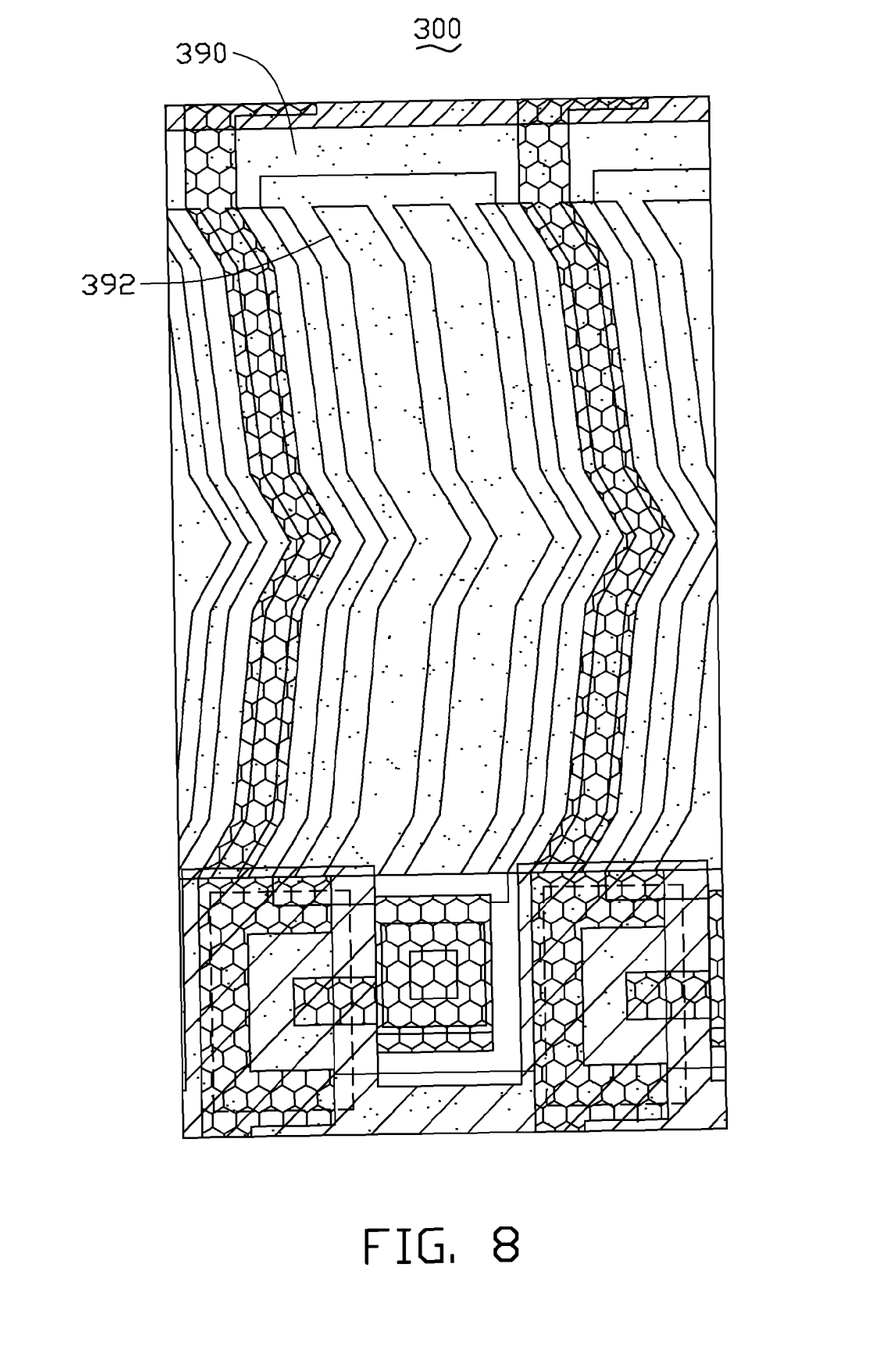
FIG. 8 is a cross-sectional plan view of an array substrate of a liquid crystal display device according to a third embodiment.

FIG. 8 shows a cross-sectional plan view of an array substrate 300. The array substrate 300 is similar to the array substrate 100 except that the slits 392 of the second common electrode 390 are <-shaped.

Figure 9:
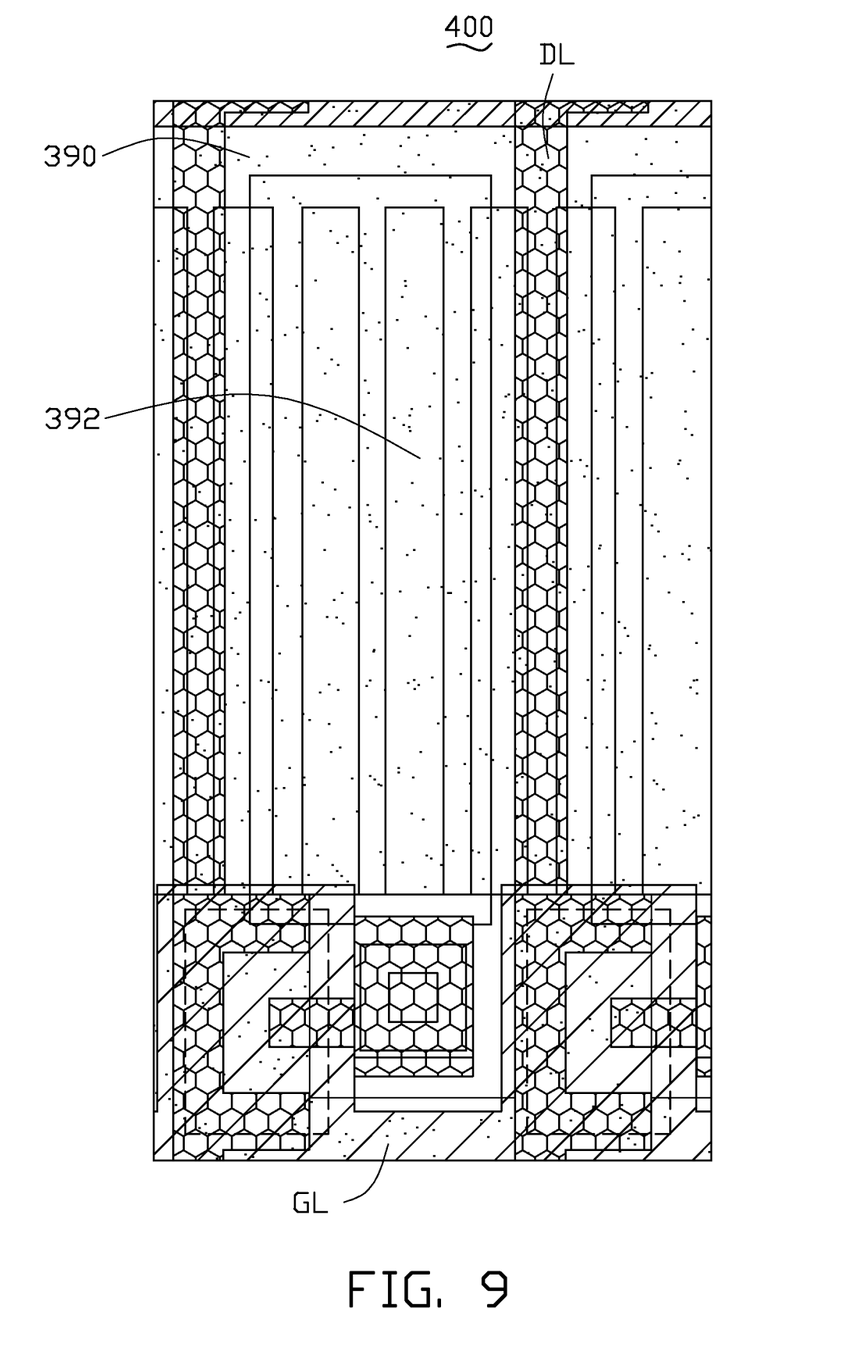
FIG. 9 is a cross-sectional plan view of an array substrate of a liquid crystal display device according to a fourth embodiment.

FIG. 9 shows a cross-sectional plan view of an array substrate 400. The array substrate 400 is similar to the array substrate 100 except that the data line DL and the slits 492 are perpendicular to the scanning line GL. Each of the slits 492 is strip-shaped.

In summary, the array substrate includes a first common electrode and a second common electrode to increases a storage capacitance per unit area. Therefore, design flexibility is increased, particularly in high-resolution LCDs. Increased storage capacitance for high-resolution LCDs and pixel density avoids flicker and crosstalk.

It is to be understood that even though numerous characteristics and advantages of the present embodiments have been set forth in the foregoing description, with details of the structures and functions of the embodiments, the disclosure is illustrative only and changes may be in detail, especially in the matter of arrangement of parts within the principles of the embodiments, to the full extent indicated by the broad general meaning of the terms in which the appended claims are expressed.

What is claimed is:

1. An array substrate comprising:
    a thin film transistor (TFT) arranged on a substrate;
    a storage capacitor including:
        a first common electrode;
        a first protection layer on the first common electrode;
        a pixel electrode on the first protection layer;
        a second protection layer on the pixel electrode; and
        a second common electrode arranged on the second protection layer and electrically coupled to the first common electrode, the second common electrode having a plurality of slits;

wherein the TFT has a drain electrode; the pixel electrode is electrically connected to the drain electrode of the TFT arranged on the substrate; the pixel electrode is insulated from the first common electrode, and the second common electrode is insulated from the TFT; wherein the array substrate further comprises a passivation layer covering the TFT, and a planar layer covering the passivation layer, wherein a first opening hole is defined in and passing through the passivation layer to expose one portion of the TFT; a second opening hole is defined in the first common electrode and is in an air communication with the first opening hole, a diameter of the second opening hole is greater than a diameter of the first opening hole; and a third opening hole is defined in the first protection layer to expose the one portion of a drain the TFT.

2. The array substrate of claim 1, wherein the storage capacitor is located in the planar layer.

3. The array substrate of claim 1, wherein the pixel electrode is electrically coupled to the TFT by the third opening hole.

4. The array substrate of claim 1, wherein a fourth opening hole is defined in the second common electrode, and a diameter of the fourth opening hole is equal to a diameter of the second opening hole.

5. The array substrate of claim 1, wherein a first storage capacitor is formed by the first common electrode and the pixel electrode; and a second storage capacitor is formed by the second common electrode and the pixel electrode.

6. The array substrate of claim 1, further comprising a plurality of scanning lines and a plurality of data lines, the scanning lines and the data lines define multiple sub-pixels where the scanning lines cross the data lines, wherein the pixel electrode is plate-shaped electrode in each sub-pixel; the second common electrode is located between the data line and the pixel electrode.

7. The array substrate of claim 1, further comprising a plurality of scanning lines and a plurality of data lines, the scanning lines and the data lines define multiple sub-pixels where the scanning lines cross the data lines, wherein the first common electrode continuously covers the plurality of sub-pixels.

8. The array substrate of claim 1, further comprising a plurality of scanning lines and a plurality of data lines, the scanning lines and the data lines define multiple sub-pixels where the scanning lines cross the data lines, wherein the second common electrode overlaps with the first common electrode to continuously cover the plurality of sub-pixels.

9. The array substrate of claim 1, further comprising a plurality of scanning lines and a plurality of data lines, the scanning lines and the data lines define multiple sub-pixels where the scanning lines cross the data lines, wherein the first common electrode comprises a plurality of strip-shaped common electrodes and a plurality of connection portions; and wherein each connection portion of the first common electrode overlaps one part of one data line.

10. A liquid crystal display device, comprising:
an array substrate comprising:
a thin film transistor arranged on a substrate;
a storage capacitor comprising:
a first common electrode;
a first protection layer arranged on the first common electrode;
a pixel electrode arranged on the first protection layer;
a second protection layer arranged on the pixel electrode;
a second common electrode arranged on the second protection layer; and the second common electrode electrically coupled to the first common electrode, and the second common electrode having a plurality of slits;

wherein the TFT has a drain electrode; the pixel electrode is electrically connected to the drain electrode of the TFT arranged on the substrate; the pixel electrode is insulated from the first common electrode, and the second common electrode is insulated from the TFT;

wherein the array substrate further comprises a passivation layer covering the TFT, and a planar layer covering the passivation layer, wherein a first opening hole is defined in and passing through the passivation layer to expose one portion of the TFT; a second opening hole is defined in the first common electrode and is in an air communication with the first opening hole, a diameter of the second opening hole is greater than a diameter of the first opening hole; and a third opening hole is defined in the first protection layer to expose the one portion of a drain the TFT.

11. The liquid crystal display device of claim 10, wherein the storage capacitor is located in the planar layer.

12. The liquid crystal display device of claim 10, wherein the pixel electrode is electrically coupled to the TFT via the third opening hole.

13. The liquid crystal display device of claim 10, wherein a fourth opening hole is defined in the second common electrode, and a diameter of the fourth opening hole is equal to a diameter of the second opening hole; the second common electrode is insulated from the pixel electrode by the fourth opening hole.

14. The liquid crystal display device of claim 10, wherein a first storage capacitor is formed by the first common electrode and the pixel electrode; and a second storage capacitor is formed by the second common electrode and the pixel electrode.

15. The liquid crystal display device of claim 10, further comprising a plurality of scanning lines and a plurality of data lines, the scanning lines and the data lines define multiple sub-pixels where the scanning lines cross the data lines, wherein the pixel electrode is plate-shaped electrode in each sub-pixel; the second common electrode is located between the data line and the pixel electrode.

16. The liquid crystal display device of claim 10, further comprising a plurality of scanning lines and a plurality of data lines, the scanning lines and the data lines define multiple sub-pixels where the scanning lines cross the data lines, wherein the first common electrode continuously covers the plurality of sub-pixels.

17. The liquid crystal display device of claim 10, further comprising a plurality of scanning lines and a plurality of data lines, the scanning lines and the data lines define multiple sub-pixels where the scanning lines cross the data lines, wherein the second common electrode overlaps with the first common electrode to continuously cover the plurality of sub-pixels.

18. The liquid crystal display device of claim 10, further comprising a plurality of scanning lines and a plurality of data lines, the scanning lines and the data lines define multiple sub-pixels where the scanning lines cross the data lines, wherein the first common electrode comprises a plurality of strip-shaped common electrodes and a plurality of connection portions and each connection portion of the first common electrode overlaps one part of one data line.

* * * * *